United States Patent [19]

Selna et al.

[11] Patent Number: 5,280,409
[45] Date of Patent: Jan. 18, 1994

[54] HEAT SINK AND COVER FOR TAB INTEGRATED CIRCUITS

[75] Inventors: Erich Selna, Mountian View; Ehsan Ettehadieh, Albany; James LaGassa, Cupertino, all of Calif.

[73] Assignee: Sun Microsystems, Inc., Mountain View, Calif.

[21] Appl. No.: 958,924

[22] Filed: Oct. 9, 1992

[51] Int. Cl.$^5$ .............................. H05K 7/20
[52] U.S. Cl. .................. 361/720; 174/16.3; 257/706; 257/722; 257/718; 361/702
[58] Field of Search ............ 174/16.3; 257/706, 708, 257/722, 726, 718, 719; 361/383, 386–389, 401, 414

[56] References Cited

U.S. PATENT DOCUMENTS

| | | | |
|---|---|---|---|
| 4,030,001 | 6/1977 | Medley, Jr. et al. | 361/401 |
| 4,660,123 | 4/1987 | Hermann | 361/386 |
| 4,739,448 | 4/1988 | Rowe et al. | 361/414 |
| 4,867,235 | 9/1989 | Grapes et al. | 361/388 |
| 4,924,352 | 5/1990 | Septfons | 361/388 |
| 4,959,900 | 10/1990 | de Givry et al. | 361/388 |
| 5,050,040 | 9/1991 | Gondusky et al. | 361/388 |
| 5,099,550 | 3/1992 | Beane et al. | 361/388 |
| 5,113,315 | 5/1992 | Capp et al. | 361/387 |
| 5,168,425 | 12/1992 | Radack, Jr. | 361/388 |

FOREIGN PATENT DOCUMENTS

| | | | |
|---|---|---|---|
| 2413016 | 8/1979 | France | 361/386 |

OTHER PUBLICATIONS

IBM, "IBM Technical Disclosure Bulletin" vol. 14, No. 11, Apr. 1972, Replaceable Chip to Heat Sink Connection on Circuit Boards.

IBM, "IBM Technical Disclosure Bulletin" vol. 31, No. 6, Nov. 1988, Heat Sink Assembly for TAB-Mounted Devices, p. 372.

*Primary Examiner*—Gregory D. Thompson
*Attorney, Agent, or Firm*—Blakely Sokoloff Taylor & Zafman

[57] ABSTRACT

An apparatus providing a heat sink and protective cover for a Tape Automated Bonding ("TAB") integrated circuit mounted on a printed circuit board. The apparatus is comprised of a printed circuit board with a plurality of thermal vias drilled through it. The TAB integrated circuit is mounted on the printed circuit board over the thermal vias. The vias draw then heat generated by the TAB integrated circuit to the other side of the printed circuit board. A heat sink is then placed over the thermal vias on the opposite side of the board to dissipate the heat. The heat sink is held in place by a spring clip which hooks onto a molded plastic cover placed over the TAB integrated circuit. The apparatus is easy to manufacture and efficiently dissipates the heat generated by TAB integrated circuits.

11 Claims, 11 Drawing Sheets

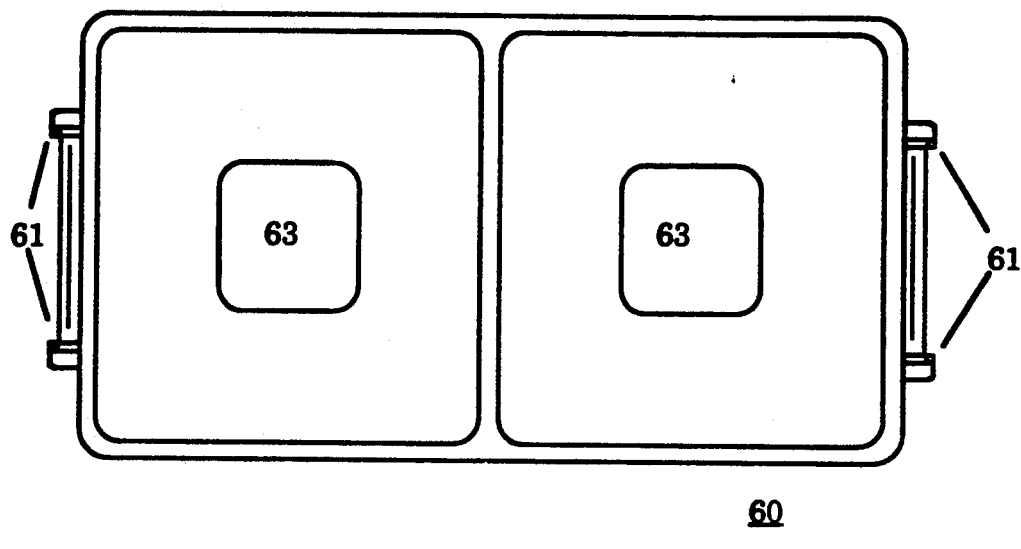
*Figure 6a*
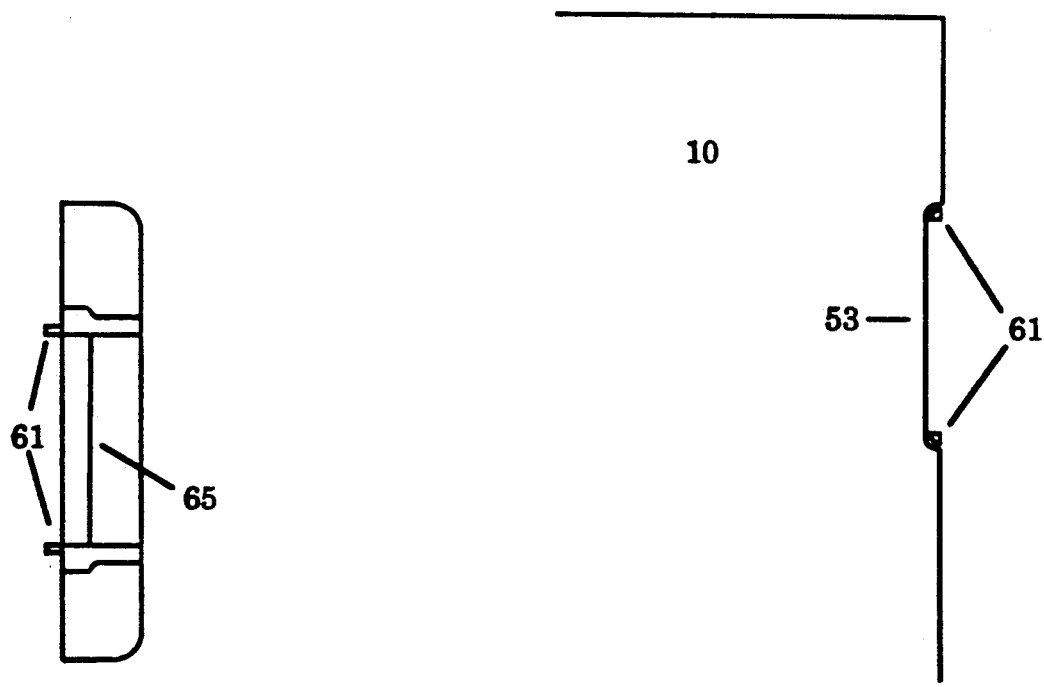
*Figure 6b*     *Figure 6c*

HEAT SINK AND COVER FOR TAB INTEGRATED CIRCUITS

BACKGROUND OF THE INVENTION

1. Field of the Invention

The present invention relates to a heat sink and a protective cover for a tape automated bonding ("TAB") integrated circuit mounted onto a printed circuit board. Furthermore, the present invention relates to a method and apparatus for dissipating heat generated by a TAB integrated circuit mounted on a printed circuit board.

2. Art Background

The high speed and high power integrated circuits created today generate significant amounts of heat. The heat generated inside of an integrated circuit must be efficiently transferred away from the integrated circuit and dissipated. If the heat is not dissipated the circuit's performance will degrade, or, worse, the circuit might overheat and malfunction.

A simple and effective way to dissipate the heat generated by an integrated circuit is to attach a heat sink to the integrated circuit package. A heat sink is a piece of heat conductive material having a large surface area. Since the heat sink conducts heat well, it draws the heat away from the integrated circuit and spreads it throughout the body of the heat sink. The large surface area of the heat sink then distributes the heat to the surrounding air which carries it away. The efficiency of a heat sink can be improved by adding a fan to the system to circulate the air, thereby improving the process of transferring heat from the heat sink to the surrounding air.

A Pin Grid Array ("PGA") style integrated circuit package consists of a rectangular plastic or ceramic package with a plurality of pins protruding from the bottom of the package. PGA integrated circuits are often inserted into PGA sockets which are mounted onto a printed circuit board. Alternatively a PGA integrated circuit can be mounted directly onto a printed circuit board.

To efficiently cool a high wattage PGA integrated circuit, a heat sink can simply be clipped on to the PGA integrated circuit. Examples of this device are illustrated in FIG. 1a and FIG. 1b and are manufactured by International Electronic Research Corporation of Burbank, Calif. Referring to FIG. 1a, a heat sink 1 is attached to a PGA integrated circuit 11 using a spring clip 7. The spring clip 7 clips into the gap between the PGA integrated circuit 11 and the PGA socket 13. Referring to FIG. 1b, a heat sink 1 is attached to the PGA integrated circuit 11, which is mounted directly onto a printed circuit board 10. In the arrangement of FIG. 1b, the spring clip 7 clips into the gap between the PGA integrated circuit 11 and the printed circuit board 10.

The technique of clipping a heat sink onto an integrated circuit, however, does not work for chips mounted in TAB (tape automated bonding) integrated circuits packages. TAB integrated circuit packaging is a relatively new form of integrated circuit packaging which reduces the size of the integrated circuit package and increases the number of leads.

The reason that heat sinks cannot be clipped onto TAB integrated circuit packages is that TAB integrated circuit packages are usually directly attached to the printed circuit board. This is illustrated in FIG. 1c. Referring to FIG. 1c, a TAB integrated circuit 5 is shown directly attached to a printed circuit board 10. As can be seen at the contact point 7 where the TAB integrated circuit 5 and the printed circuit board 10 meet, there is no gap where a spring clip could clip onto and attach a heat sink.

Although TAB integrated circuits tend to be smaller than PGA integrated circuits, TAB integrated circuits typically incur bigger problems releasing thermal energy efficiently. This is due to the smaller leads and the smaller package size of TAB integrated circuits, which decrease the ability to dissipate heat.

SUMMARY OF THE INVENTION

A method and apparatus is described for attaching a heat sink to a Tape Automated Bonding ("TAB") integrated circuit ("IC"). As is performed during normal TAB fabrication, the TAB integrated circuit is mounted directly onto the PC board. However, at least one thermal via is located beneath the TAB IC to draw away the heat generated by the IC through the PC board to the opposing surface of the PC board. A head-dissipation mechanism is coupled to thermal vias on the side of the PC board opposing the TAB IC to dissipate the heat. In this manner thermal control is achieved without affecting the TAB IC. In one embodiment, the TAB integrated circuit is mounted on the printed circuit board, having a plurality of thermal vias. The thermal vias are utilized to draw the heat generated by the TAB integrated circuit to the other side of the printed circuit board. A heat sink is then placed over the thermal vias on the opposite side of the board to dissipate the heat.

In order to minimize the assembly time for the TAB IC and corresponding heat dissipation mechanism, an innovative package was developed to perform a plurality of functions. A molded plastic cover is provided which spans the width of the PC board. This cover provides a protective cover for the TAB IC, which is can be damaged by mishandling. Furthermore, the cover provides a latching mechanism to hold the heat sink, located on the opposing surface, in place. Spring clips are then used to hold the heat sink and plastic cover in place without affecting the TAB IC.

BRIEF DESCRIPTION OF THE DRAWINGS

The objects, features and advantages of the present invention will be apparent to one skilled in the art, in view of the following detailed description in which:

FIG. 6a illustrates the bottom view of a molded cover for the second embodiment of a heat sink apparatus for a Tape Automated Bonding (TAB) integrated circuit.

FIG. 6b illustrates a side view of a molded cover for the second embodiment of a heat sink apparatus for a Tape Automated Bonding (TAB) integrated circuit.

FIG. 6c illustrates how the locator pins on the molded cover for the second embodiment align the molded cover onto the printed circuit board.

DETAILED DESCRIPTION OF THE INVENTION

A heat sink and protective cover for a TAB integrated circuit mounted on a printed circuit board is disclosed. In the following description, for purposes of explanation, specific nomenclature is set forth to provide a through understanding of the present invention. However, it will be apparent to one skilled in the art that these specific details are not required in order to practice the present invention. In other instances, well known circuits and devices are shown in block diagram form in order not to obscure the present invention unnecessarily.

TAB integrated circuits are often manufactured with the integrated circuit die "face up" such that the back of the die faces the bottom of the integrated circuit package. To cool the TAB integrated circuit, a heat dissipater mechanism must draw heat away from the bottom of the TAB integrated circuit which contacts the printed circuit board. In a first embodiment of a TAB integrated circuit heat sink apparatus, a conductive piece of metal, referred to as a heat slug, contacts the bottom of the TAB integrated circuit. The heat slug draws the heat generated by the integrated circuit to the opposite side of the printed circuit board where a heat sink is attached to dissipate the heat.

To construct the first embodiment, the printed circuit (PC) board is fabricated with an opening at the location where the TAB integrated circuit is to be mounted. A heat slug is placed in the opening such that the slug contacts both surfaces of the PC board. The TAB integrated circuit is attached to one surface at the location of the heat slug and a heat sink is attached on the opposing surface. The heat slug functions to draw the heat away from the TAB integrated circuit to the other side of the printed circuit board where the heat sink is attached. The heat is then dissipated by the heat sink.

Figure 1A:
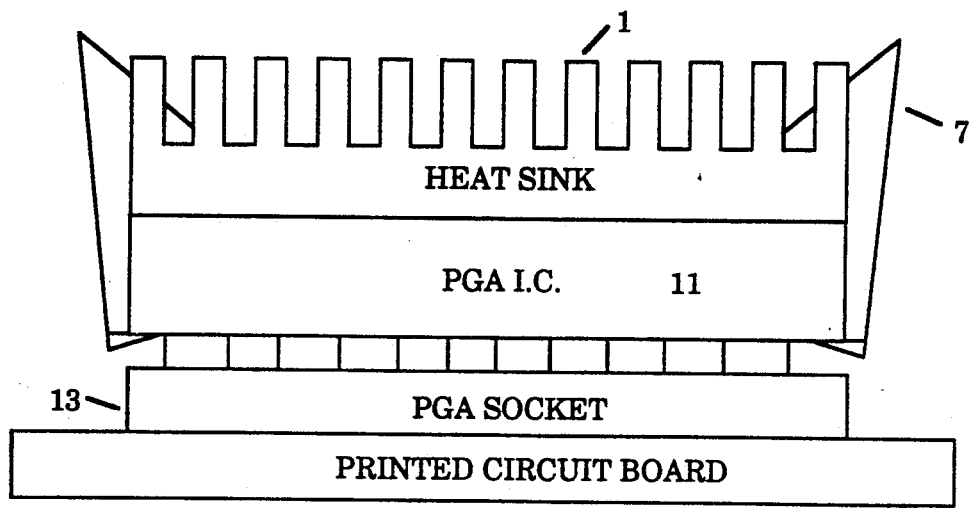
FIG. 1a depicts a prior art arrangement in which a heat sink is clipped onto a Pin Grid Array integrated circuit which has been placed into a Pin Grid Array socket.
Figure 1B:
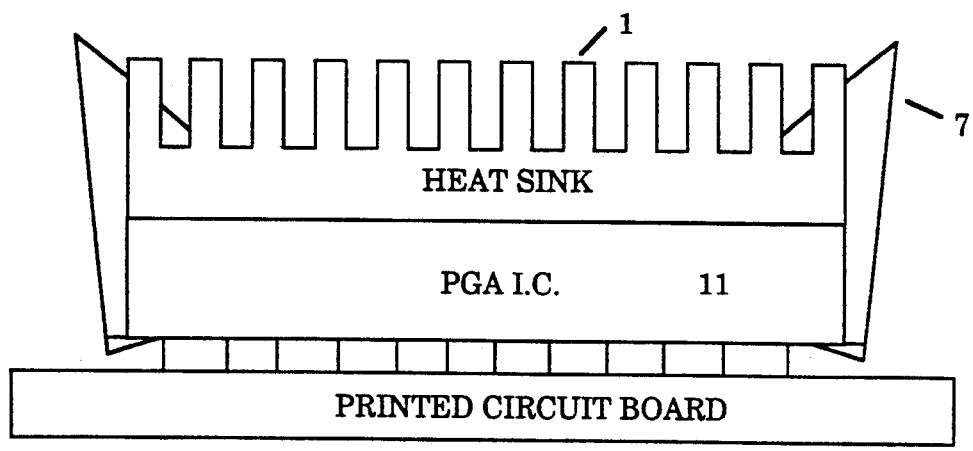
FIG. 1b depicts a prior art arrangement in which a heat sink is clipped onto a Pin Grid Array integrated circuit which has been mounted directly onto a printed circuit board.
Figure 1C:
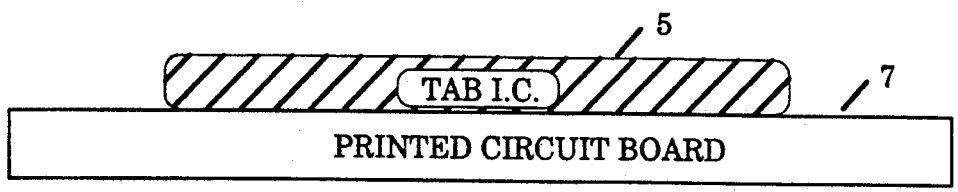
FIG. 1c depicts a Tape Automated Bonding (TAB) integrated circuit mounted onto a printed circuit board.
Figure 2:
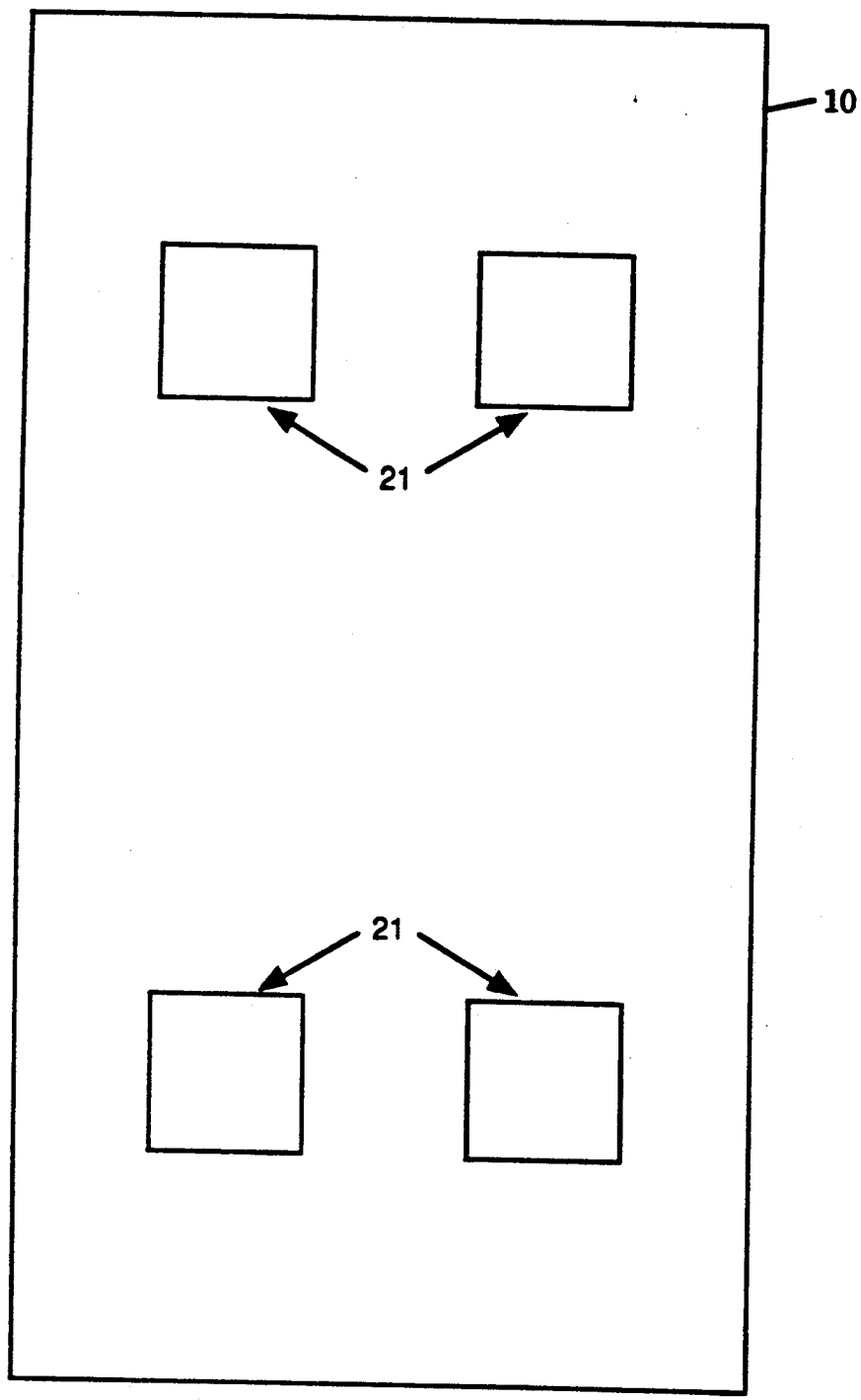
FIG. 2 illustrates a printed circuit board that has been prepared for the first embodiment of a heat sink apparatus for a Tape Automated Bonding (TAB) integrated circuit.

Referring to FIG. 2, a printed circuit board 10 which has been prepared for the first embodiment of the heat sink apparatus is shown. The printed circuit board 10 has been fabricated with four rectangular holes 21 at the locations where the TAB integrated circuits are to be mounted. The rectangular holes 21 are preferably of a size which is smaller that the TAB integrated circuits, but slightly larger than the heat slug which will be inserted into the rectangular hole 21.

Figure 3:
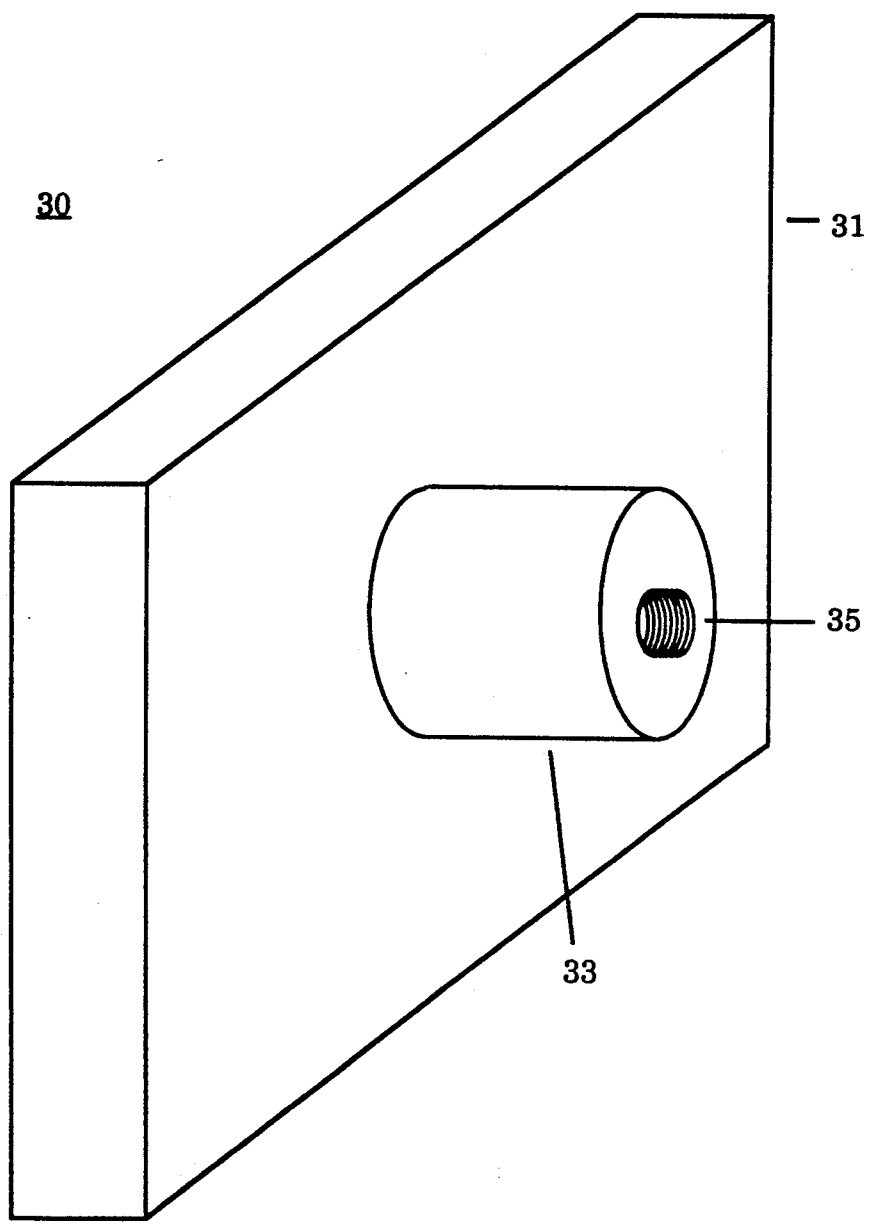
FIG. 3 illustrates a heat slug for the first embodiment of a heat sink apparatus for a Tape Automated Bonding (TAB) integrated circuit.

Referring to FIG. 3, an exemplary heat slug 30 is shown. The heat slug 30 is comprised of a base 31 and a threaded stud 33 which resembles the shaft of a bolt. The threaded stud 33 is used to connect a heat sink to the heat slug 30. The heat slug base 31 is inserted into the rectangular holes 21 of the printed circuit board 10 in FIG. 2, such that the heat slug base 31 is flush with the printed circuit board 10. A bonding agent, such as epoxy, is then added to hold the heat slug 30 in place.

After the holes have been cut into the printed circuit board and the heat slugs attached, the TAB integrated circuits are mounted onto the printed circuit board 10. Finally, a heat sink is attached to the threaded stud 33 on the heat slug 30 on the other side of the printed circuit board 10. A completed assembly of the first embodiment is illustrated in cross-sectional view in FIG. 4.

Figure 4:
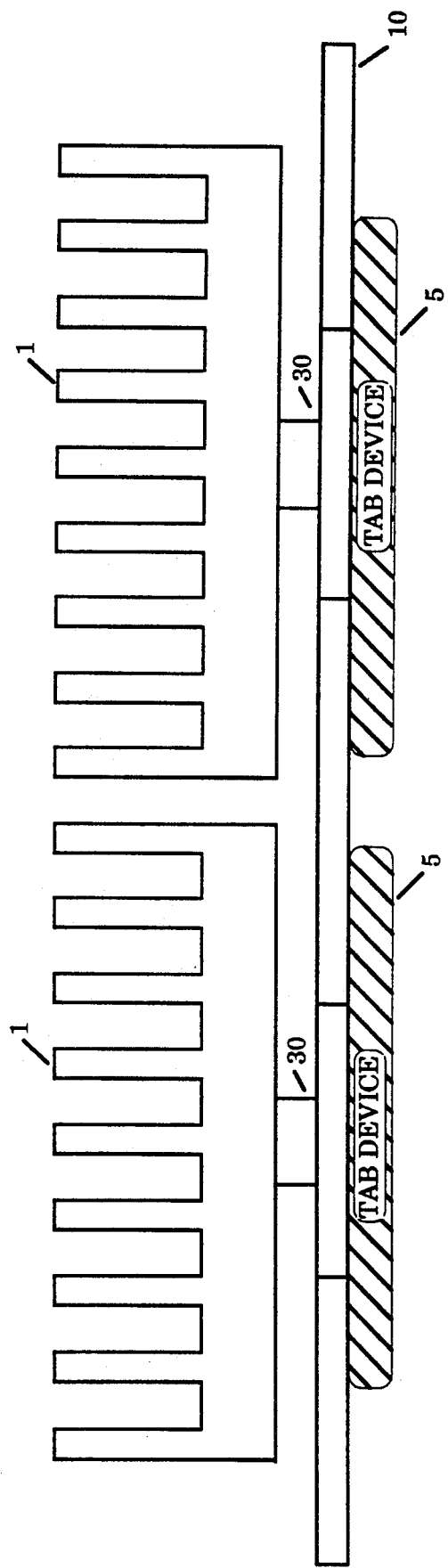
FIG. 4 is a cross-sectional view showing the final assembly of the first embodiment of a heat sink apparatus for a Tape Automated Bonding (TAB) integrated circuit.

Referring to the cross-sectional view of FIG. 4, two TAB integrated circuits 5 are shown attached to printed circuit board 10. Heat slugs 30 have been inserted into the holes cut into printed circuit board 10. A pair of disc-fin heat sinks 1 are attached to the threaded studs of the heat slugs 30. The heat generated by the TAB integrated circuits 5 is drawn up through the heat slugs 30 into disc-fin heat sinks 1 where the heat is dissipated into the surrounding air.

In a second embodiment of the present invention, a plurality of small thermal vias are provided in the printed circuit board where the TAB integrated circuits are to be mounted. Preferably these vias are provided by drilling holes using automated drilling equipment typically found in a PC fabrication facility to simplify the manufacturing process. The vias are then plated with a heat conductive material such as copper. The heat conductive material in the vias draws the heat generated by the TAB integrated circuit to the opposing side of the printed circuit board. A heat sink is then placed on the opposing surface over the vias to conduct the heat and dissipate the heat into the surrounding air.

Figure 5:
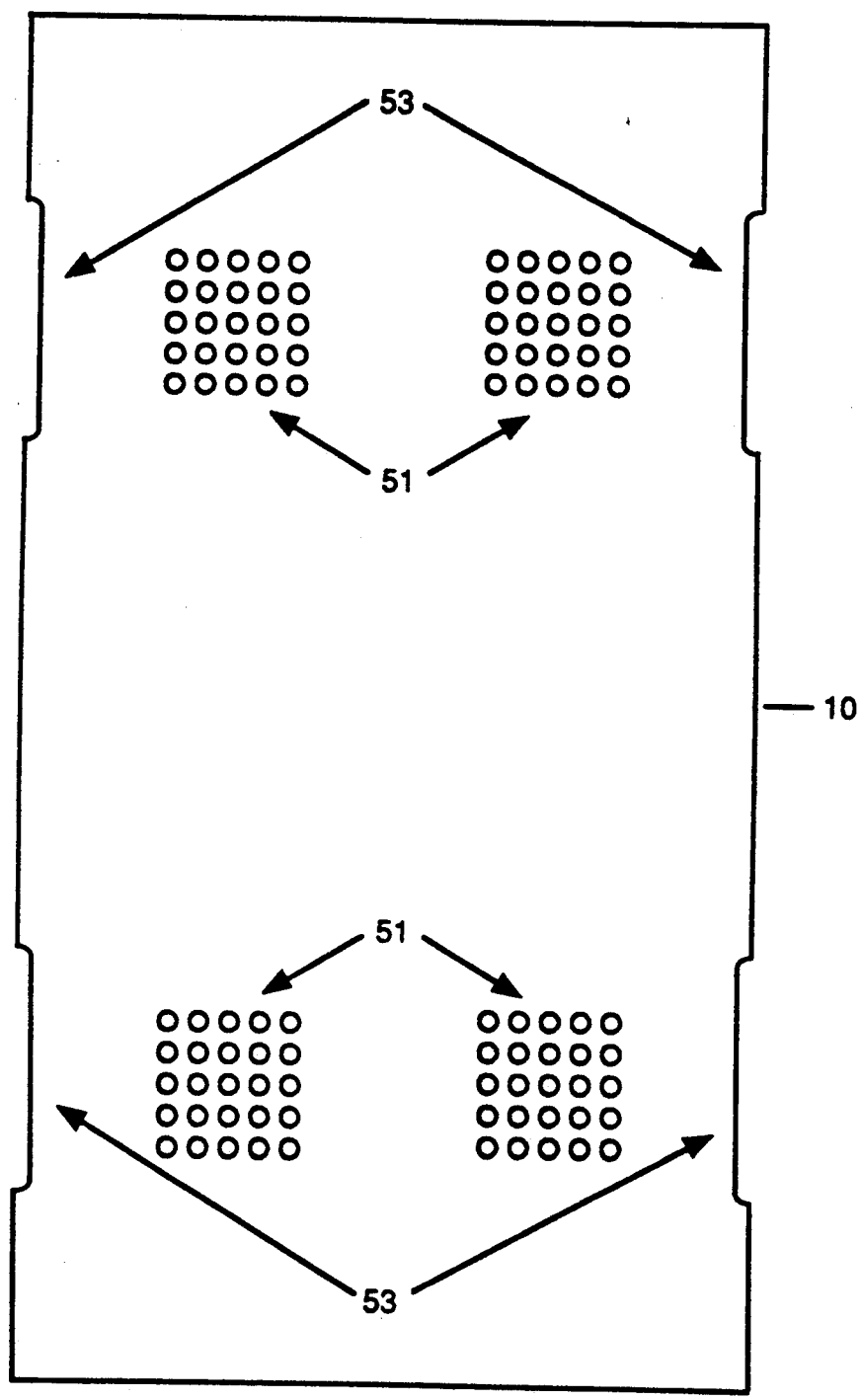
FIG. 5 illustrates a printed circuit board that has been prepared for the second embodiment of a heat sink apparatus for a Tape Automated Bonding (TAB) integrated circuit.

Referring to FIG. 5, a printed circuit board 10 which has been prepared for the second embodiment is shown. The printed circuit board 10 has a plurality of vias 51 drilled where the TAB integrated circuits are to be mounted. The vias 51 drilled into the printed circuit board 10 are of large enough size to efficiently conduct heat when plated with heat conductive material. A variety of heat conductive materials can be used to plate the vias. However, copper is preferably used, as this step can be easily performed with small modification with equipment for plating through holes found in most PC fabrication facilities. As for this preparation of or assembly of the heat dissipation mechanism, matching pairs of notches 53 are routed into the edges of printed circuit board 10. The purpose of the notches 53 will be described below.

Referring to FIGS. 6a and 6b an exemplary molded plastic cover 60 is illustrated. After the TAB integrated circuits are mounted onto vias 51 of printed circuit board 10 of FIG. 5, the molded plastic cover 60 is placed over the TAB integrated circuits. In the present embodiment shown, the molded plastic cover 60 of FIG. 6a is shaped to cover two TAB integrated circuits. However, the shape of the molded plastic cover 60 could easily be modified to cover any number of TAB integrated circuits. The molded plastic cover 60 features windows 63 which allow inspectors to read the identification numbers on the TAB integrated circuits during the assembly process. On the sides of the molded plastic cover 60 is a ledge 65 where a metal spring (not shown) clips onto the molded plastic cover 60 holding it in place.

To simplify the assembly process, the molded plastic cover 60 has a pair of locator pins 61 which extend downward from the bottom of the molded plastic cover 60 at each end. The purpose of the locator pins 61 is to align the molded plastic cover 60 with printed circuit board 10. Referring to FIG. 6c, a cut away view illustrates how the locator pins 61 fit within the notches 53 cut into edges of the printed circuit board 10.

Figure 7:
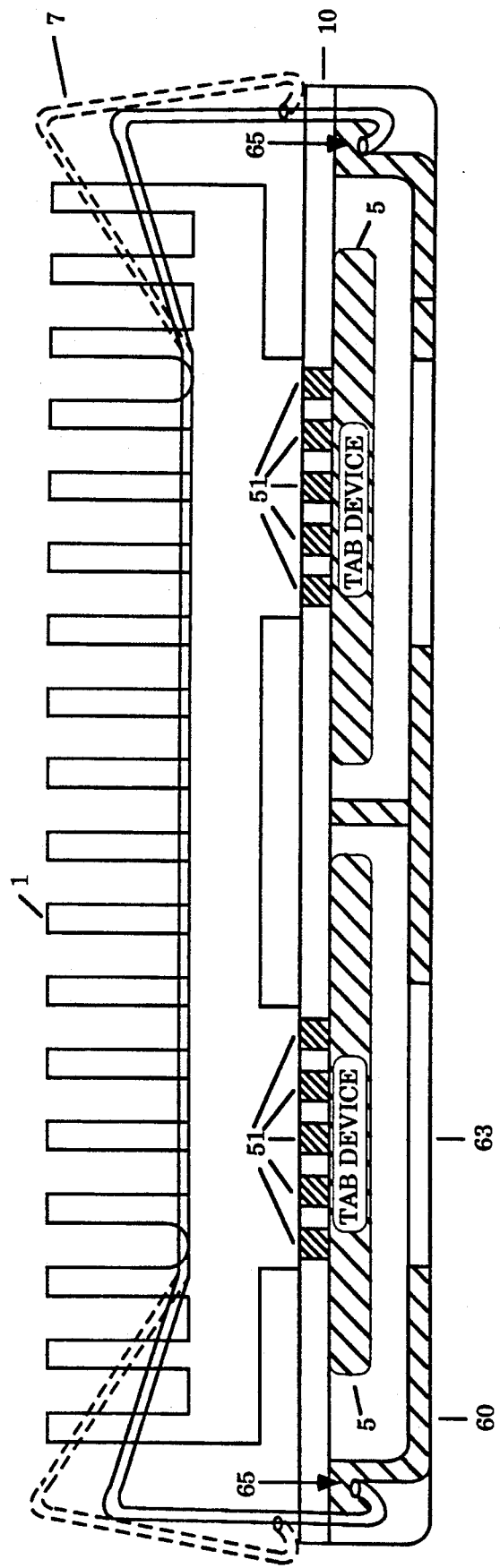
FIG. 7 is a cross-sectional view of the completed assembly of the second embodiment of a heat sink apparatus for a Tape Automated Bonding (TAB) integrated circuit.

A cross sectional view of the final assembly is illustrated in FIG. 7. Referring to FIG. 7, two TAB integrated circuits 5 are mounted onto a printed circuit board 10. At the location where the TAB integrated circuits 5 are mounted, a plurality of vias 51 have been drilled into printed circuit board 10 and plated with the heat conductive copper. Covering the TAB integrated circuits 5 is the molded plastic cover 60. The tops of the TAB integrated circuits 5 can be seen through the windows 63 in the molded plastic cover 60. On the other side of the printed circuit board 10 is the heat sink 1. The heat sink 1 is shaped to provide an extended portion which covers the thermal via area 51 on the printed circuit board 10. A layer of thermal grease can be placed between the heat sink 1 and the thermal vias 51 to help conduct heat into the heat sink 1. The heat sink 1 and the molded plastic cover 60 are held in place by a spring clip 7 which hooks around the heat sink 1 and the printed circuit board 10 onto the ledge 65 of the molded plastic cover 60. Thus an effective heat dissipation mechanism for TAB IC's is easily assembled and the molded plastic cover functions not only to protect TAB IC from physical wear, but also to hold the heat sink in place using a spring clip which clips the corner and the heat sink together.

Figure 8:
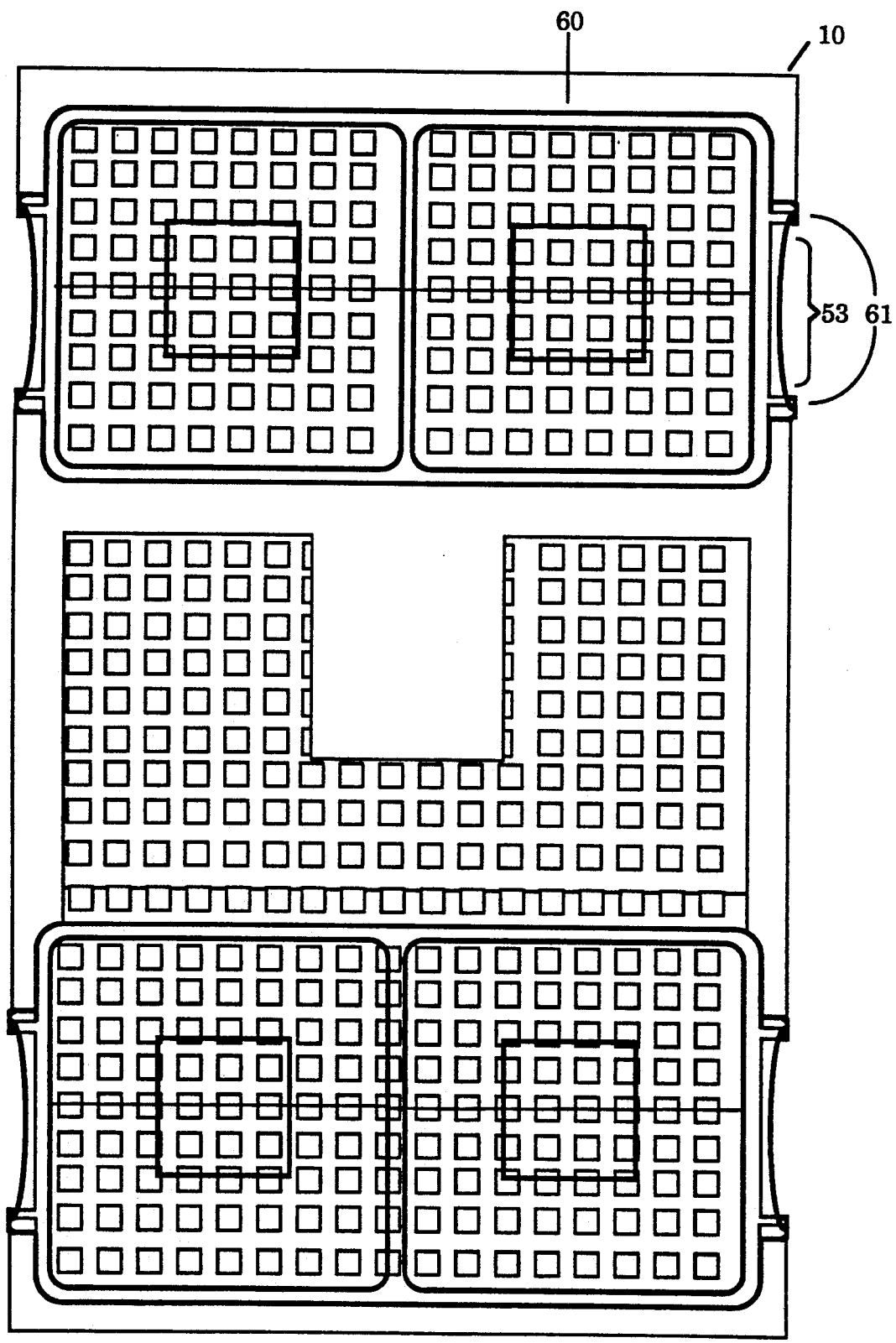
FIG. 8 is a top "see-through" view showing the second embodiment of a heat sink apparatus for a Tape Automated Bonding (TAB) integrated circuit.
Figure 9:
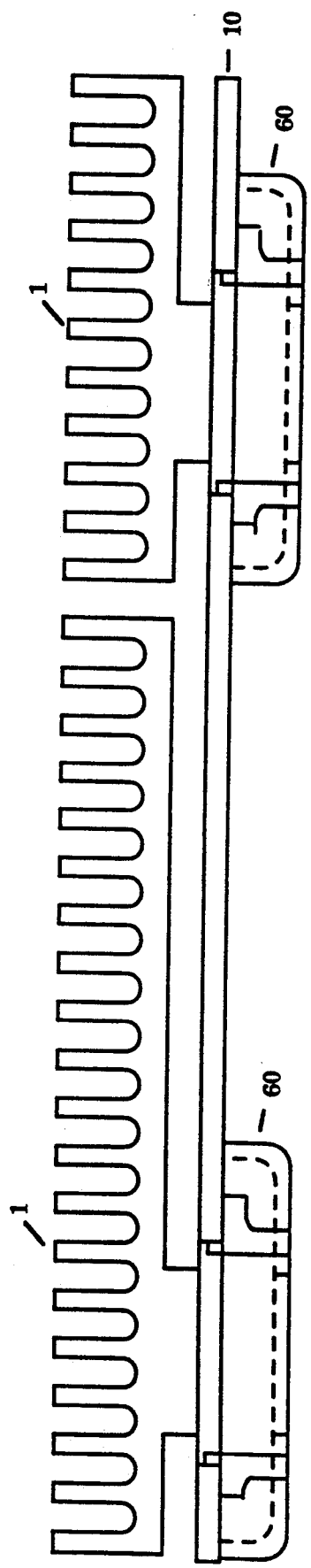
FIG. 9 is a side view of the second embodiment of a heat sink apparatus for a Tape Automated Bonding (TAB) integrated circuit.

FIGS. 8 and 9 provide an alternate embodiment of the heat sink apparatus made from the printed circuit board shown in FIG. 5. FIG. 8 provides a top "see through" view of the assembly. The molded plastic cover 60 is shown covering the printed circuit board 10 and is aligned by locator pins 61 which fit into the notch 53 of the printed circuit board 10. FIG. 9 provides a side view of the assembly.

Figure 10A:
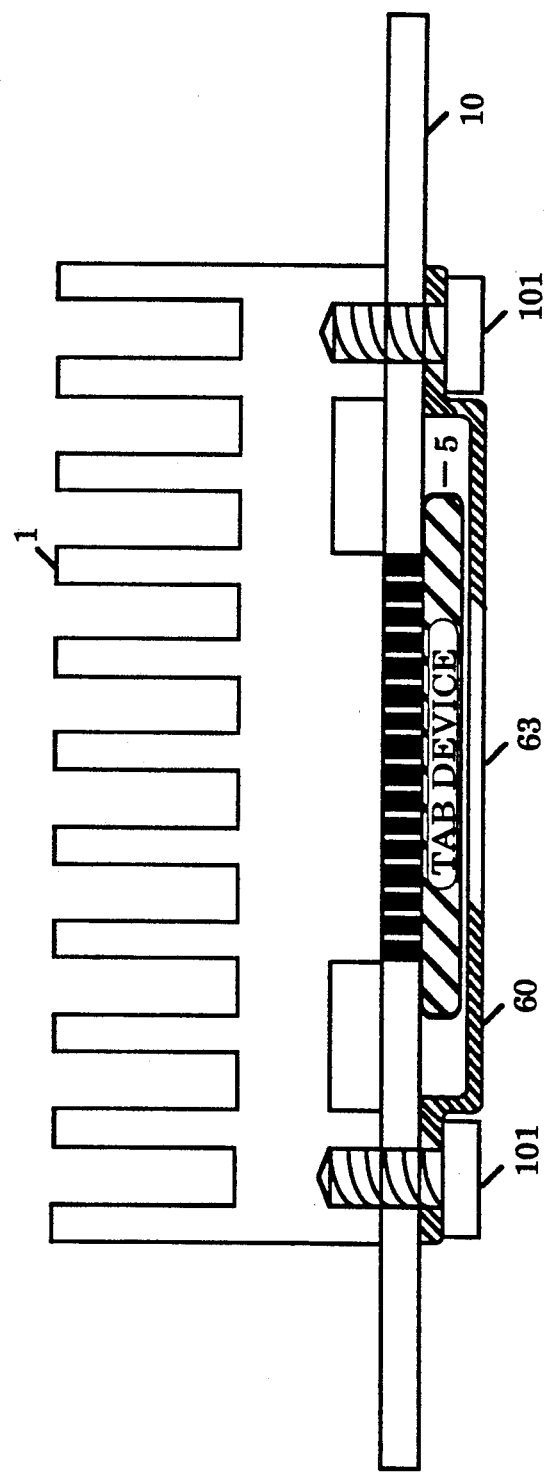
FIG. 10a is a cross-sectional view of the completed assembly of a third embodiment of a heat sink apparatus for a single Tape Automated Bonding (TAB) integrated circuit.
Figure 10B:
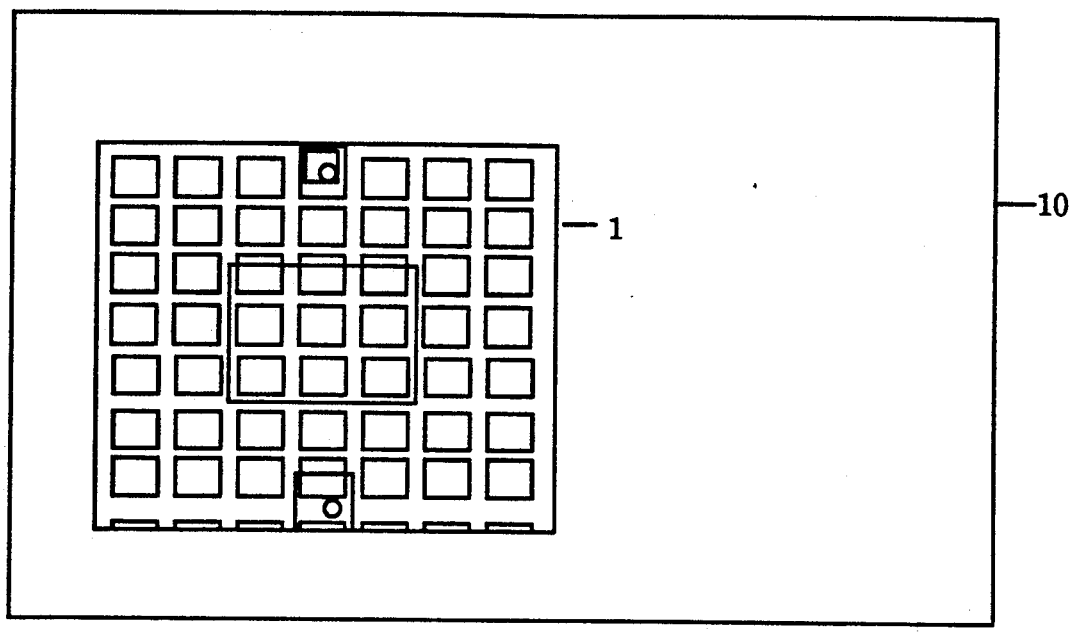
FIG. 10b is a top view of the completed assembly of the third embodiment of a heat sink apparatus for a single Tape Automated Bonding (TAB) integrated circuit.
Figure 10C:
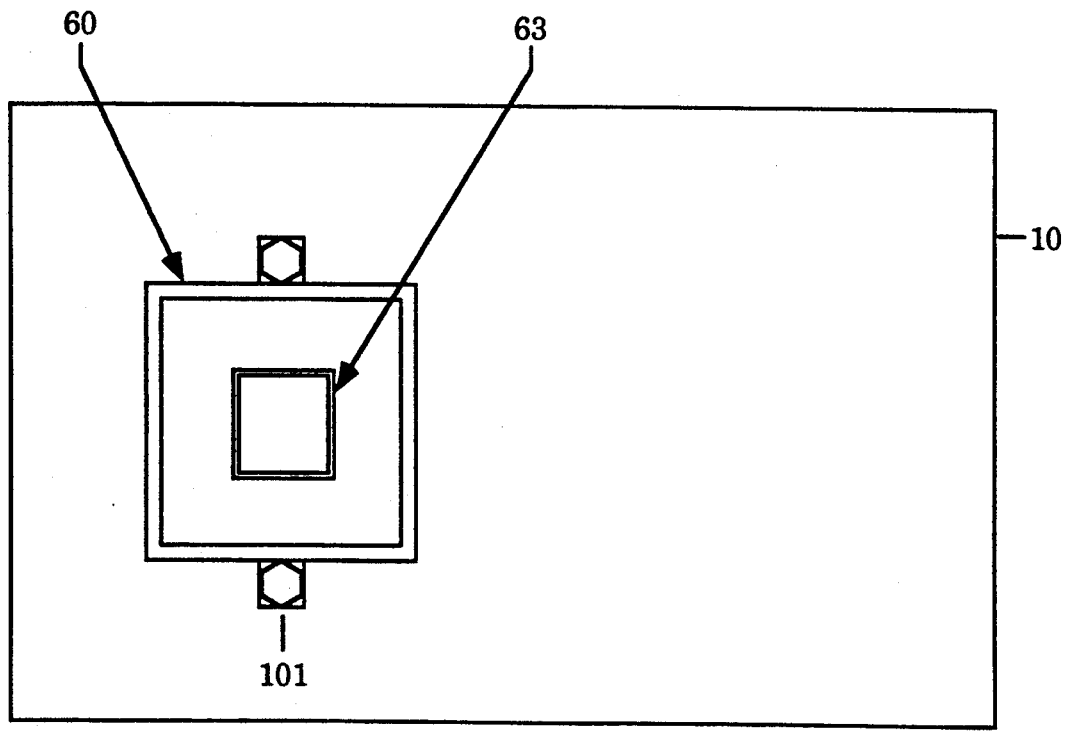
FIG. 10c is a bottom view of the completed assembly of the third embodiment of a heat sink apparatus for a single Tape Automated Bonding (TAB) integrated circuit.

FIGS. 10a, 10b, and 10c illustrate a third embodiment of the present invention. The third embodiment of the present invention is similar to the second embodiment except that the spring clip of the second embodiment which held the molded plastic cover, printed circuit board, and heat sink together has been replaced by a pair of bolts.

Referring to FIG. 10a a cross sectional view of a heat sink apparatus for a single TAB integrated circuit is shown. As in the previous embodiments, a TAB integrated circuit 5 is mounted onto a printed circuit board 10. Molded plastic cover 60 has been placed over TAB integrated circuit 5 to protect it. Two bolts 101 secure the molded plastic cover 60 onto the printed circuit board 10 by entering into a threaded bore in pin-fin heat sink 1.

FIGS. 10a and 10b shown a top and bottom view of the third embodiment of the present invention. Referring to FIG. 10b pin-fin heat sink 1 can be seen onto top of printed circuit board 10. Referring to FIG. 10b, molded plastic cover 60 is shown bolted onto the printed circuit board 10 using bolts 101. The plastic cover has a window 63 which allows inspectors to read identification numbers located on the TAB integrated circuit.

The foregoing has described a heat sink and protective cover for a TAB integrated circuit mounted on a printed circuit board. It is contemplated that changes and modifications may be made by one of ordinary skill in the art, to the materials and arrangements of elements of the present invention without departing from the spirit and scope of the invention.

We claim:

1. An apparatus for efficiently dissipating heat generated by integrated circuits mounted on printed circuit boards, said apparatus comprising:

a printed circuit board, said printed circuit board having a first side, a second side, and a plurality of edges, said printed circuit board having at least one opening through said printed circuit board, said opening having a thermal conductive material placed therein;

an integrated circuit mounted on said first side of said printed circuit board over said opening and being adjacent to said thermal conductive material; and a heat dissipation device located on said second side of said printed circuit board over said opening and contacting said thermal conductive material;

wherein heat generated by said integrated circuit is conducted from said first side through said printed circuit board opening via said thermal conductive material to said second side where it is dissipated by said heat dissipation device, a cover which encloses said integrated circuit, said cover having a ledge; and, a spring clip that couples said cover to said printed circuit board.

2. The apparatus as set forth in claim 1, wherein:

said printed circuit board includes a first notch on a first edge of said printed circuit board and a second notch on a second edge of said printed circuit board; and said cover includes a pair of locator pins located on a first and a second end of said cover for aligning said cover onto said printed circuit board.

3. The apparatus of claim 1 wherein:

said cover has at least one window.

4. The apparatus as set forth in claim 1, wherein said thermal conductive material is a vias.

5. The apparatus as claimed in claim 4, wherein the thermal conductive material comprises copper.

6. The apparatus as set forth in claim 1 wherein said thermal conductive material comprises a heat slug which fits within the opening; said heat slug containing said first surface and said second surface, said first surface contacting said integrated circuit and said second surface contacting said heat dissipation device.

7. The apparatus as set forth in claim 1, wherein said heat dissipation device comprises a heat sink.

8. The apparatus as claimed in claim 7, wherein a layer of thermal grease is placed between said printed circuit board and said heat sink.

9. The apparatus as claimed in claim 1 wherein said printed circuit board has at least one notch in an edge of said printed circuit board and said cover has at least one locator pin which fits within a recess of said notch.

10. A method for constructing an integrated circuit package efficiently cooling the integrated circuit and protecting the integrated circuit, said method comprising the steps of:

creating a via in a printed circuit board;

mounting an integrated circuit to a first side of said printed circuit board and adjacent to said via;

placing a cover over said integrated circuit on said first side of said printed circuit board;

placing a heat dissipation device to a second side of said printed circuit board and adjacent to said via; and, clasping said heat dissipation device to said printed circuit board with a spring clip that hooks onto said cover.

11. The method for mounting an integrated circuit onto a printed circuit board as claimed in claim 10 wherein said heat dissipation device is mounted to said printed circuit board using a bolt which screws through said printed circuit board and into said heat sink.

* * * * *